(12) United States Patent
Hegde et al.

(10) Patent No.: US 10,592,335 B2
(45) Date of Patent: Mar. 17, 2020

(54) USING DATA OBJECT COPIES TO IMPROVE THE PERFORMANCE OF A DISTRIBUTED STORAGE NETWORK

(71) Applicant: International Business Machines Corporation, Armonk, NY (US)

(72) Inventors: Harsha Hegde, Buffalo Grove, IL (US); Venkata G. Badanahatti, Bloomingdale, IL (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 10 days.

(21) Appl. No.: 16/051,975

(22) Filed: Aug. 1, 2018

(65) Prior Publication Data

US 2020/0042381 A1  Feb. 6, 2020

(51) Int. Cl.
*G11C 29/00* (2006.01)
*G06F 11/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/067* (2013.01); *G06F 3/0619* (2013.01); *G11C 29/52* (2013.01)

(58) Field of Classification Search
CPC ......... H04N 21/64723; H04N 7/17318; H04N 21/2187; H04N 21/234363; H04N 21/2347; H04N 21/8549; H04N 21/41407; H04N 21/4758; H04N 21/6131; H04N 21/84; H04N 21/2221; H04N 7/165; H04N 21/235; H04N 21/23106; H04N 21/2355; H04N 21/2381; H04N 21/02
See application file for complete search history.

(56) References Cited

U.S. PATENT DOCUMENTS

| 8,886,711 | B2 | 11/2014 | Palthepu et al. |
| 8,892,698 | B2 | 11/2014 | Baptist et al. |
| 9,430,336 | B2 | 8/2016 | Motwani |
| 2017/0147611 | A1 | 5/2017 | Peake |

OTHER PUBLICATIONS

Anonymous; Method and System for Classifying Memory Devices and Slices to Create Optimal Storage Decisions in Distributed Storage Network (DSN); ip.com; Jan. 9, 2018; 3 pgs.
Linux Defenders et al.; Reliable, Scalable, and High-Performance Distributed Storage: Distributed Object Storage; ip.com; Feb. 19, 2014; 11 pgs.
Mehrara, et al.; Exploiting Selective Placement for Low-cost Memory Protection; 2006 ACM Transactions on Architecture and Code Optimization; Nov. 2008; 24 pgs; vol. 5, No. 3; Art. 14.

*Primary Examiner* — Guerrier Merant
(74) *Attorney, Agent, or Firm* — Garlick & Markison; Timothy W. Markison; Kelly H. Hale

(57) ABSTRACT

A method for responding to a read request from a user for a set of encoded data slices (EDSs) in a distributed storage network begins with a processing module determining that a threshold number of encoded data slices is not available and continues with the processing module determining that one or more copies are available for the set of EDSs. The method continues with the processing module determining whether a combination of the one or more additional EDSs within the copy of the set of EDSs and the available EDSs from the set of EDSs is at least a read threshold number of EDSs, and when a read threshold is available based on the combination the processing module responds to the request using the combination.

20 Claims, 7 Drawing Sheets

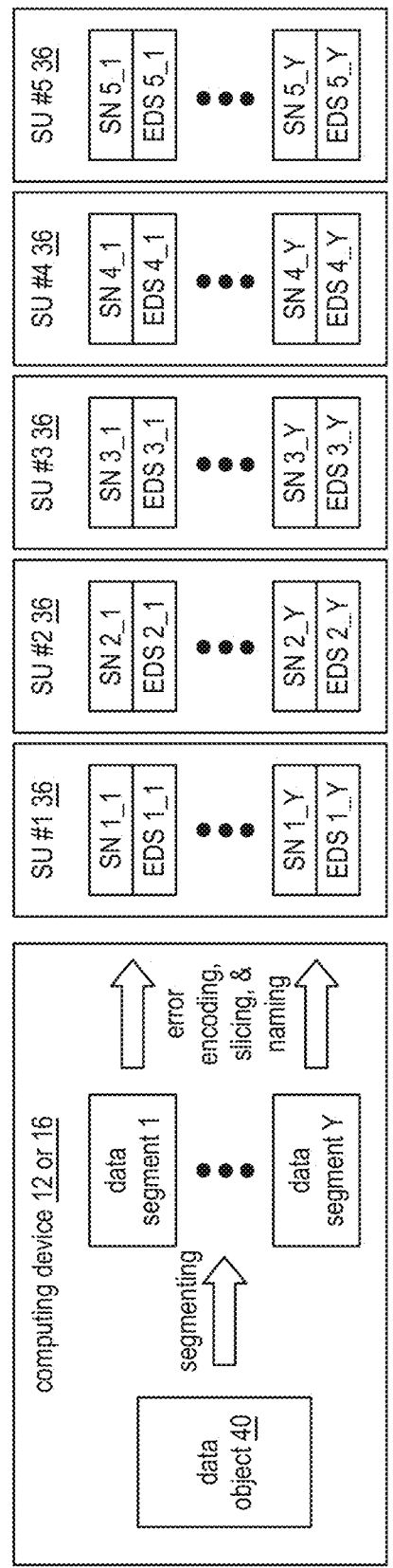
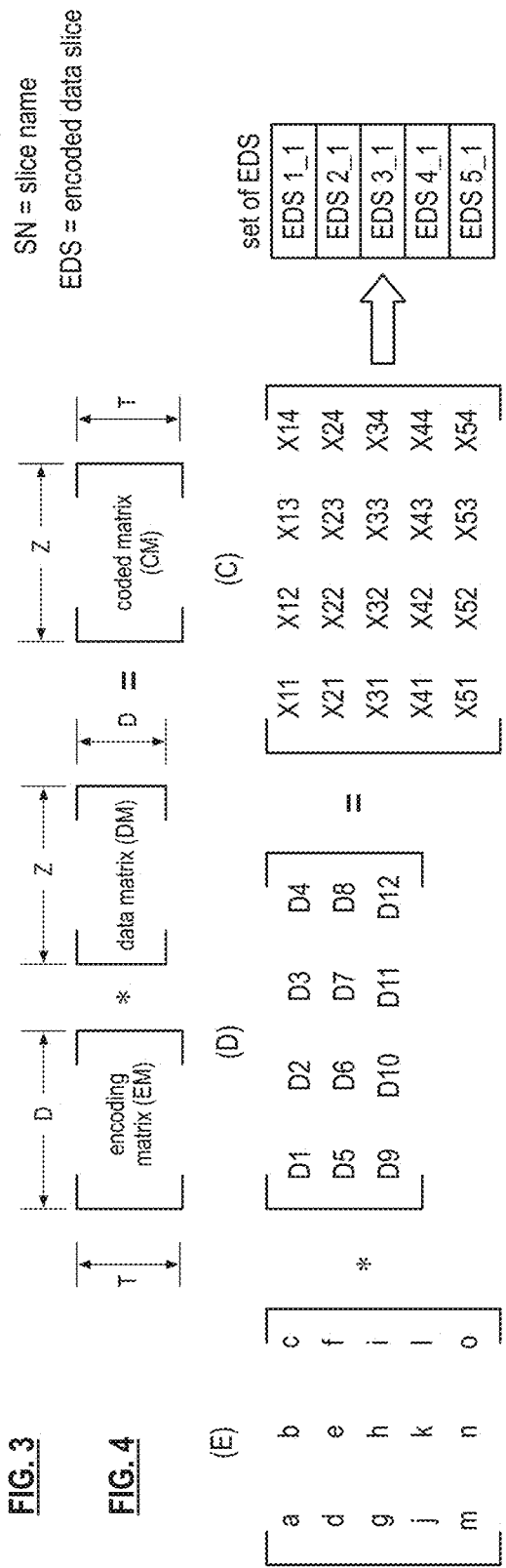
FIG. 3
FIG. 4
FIG. 5
FIG. 6

USING DATA OBJECT COPIES TO IMPROVE THE PERFORMANCE OF A DISTRIBUTED STORAGE NETWORK

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Dispersed storage systems can include copies of data objects and/or segments of data objects on different physical media. When common error correction schemes are used to encode the data objects and their copies these copies can be used to improve the performance and reliability of the dispersed storage systems.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
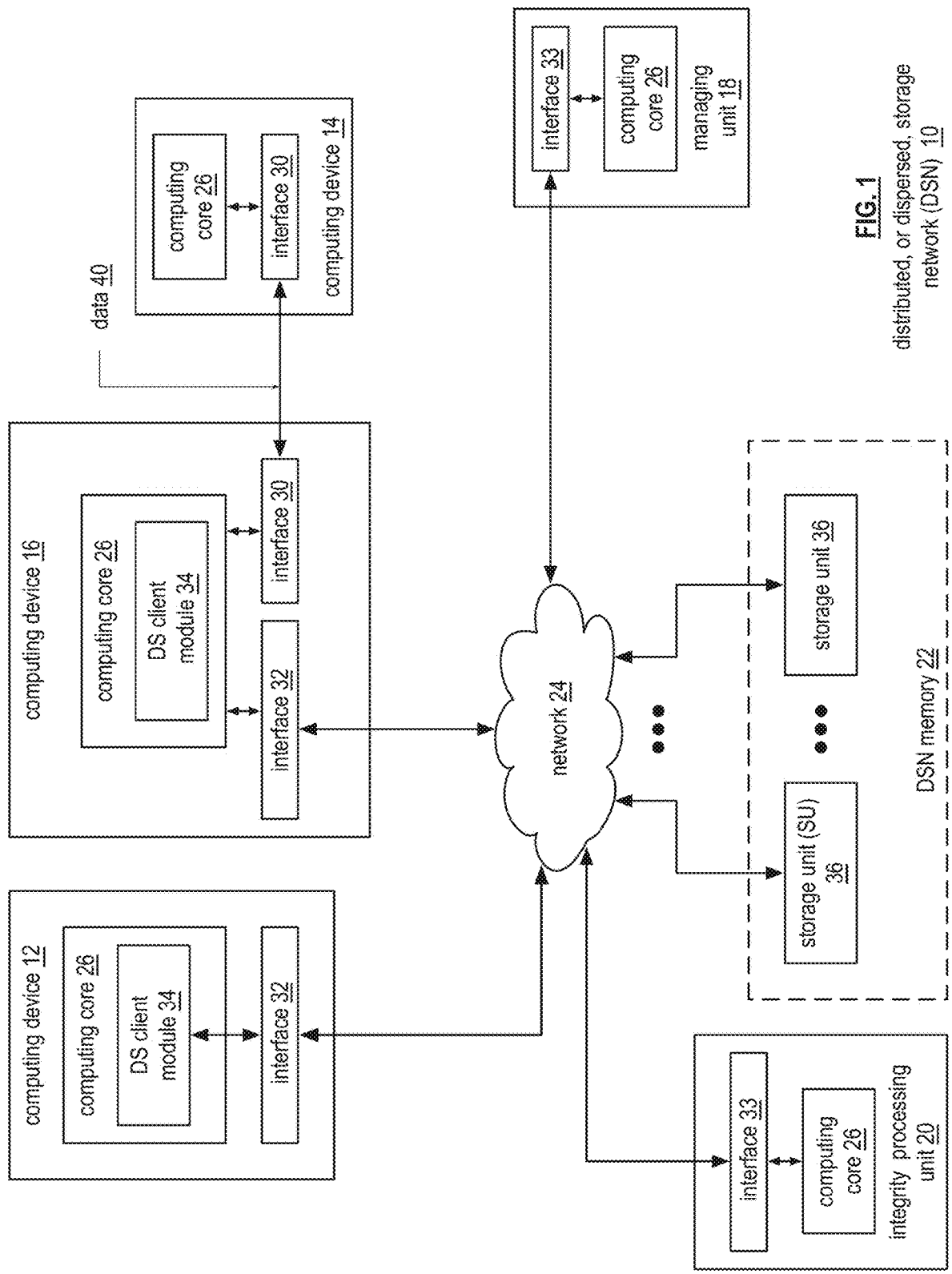
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
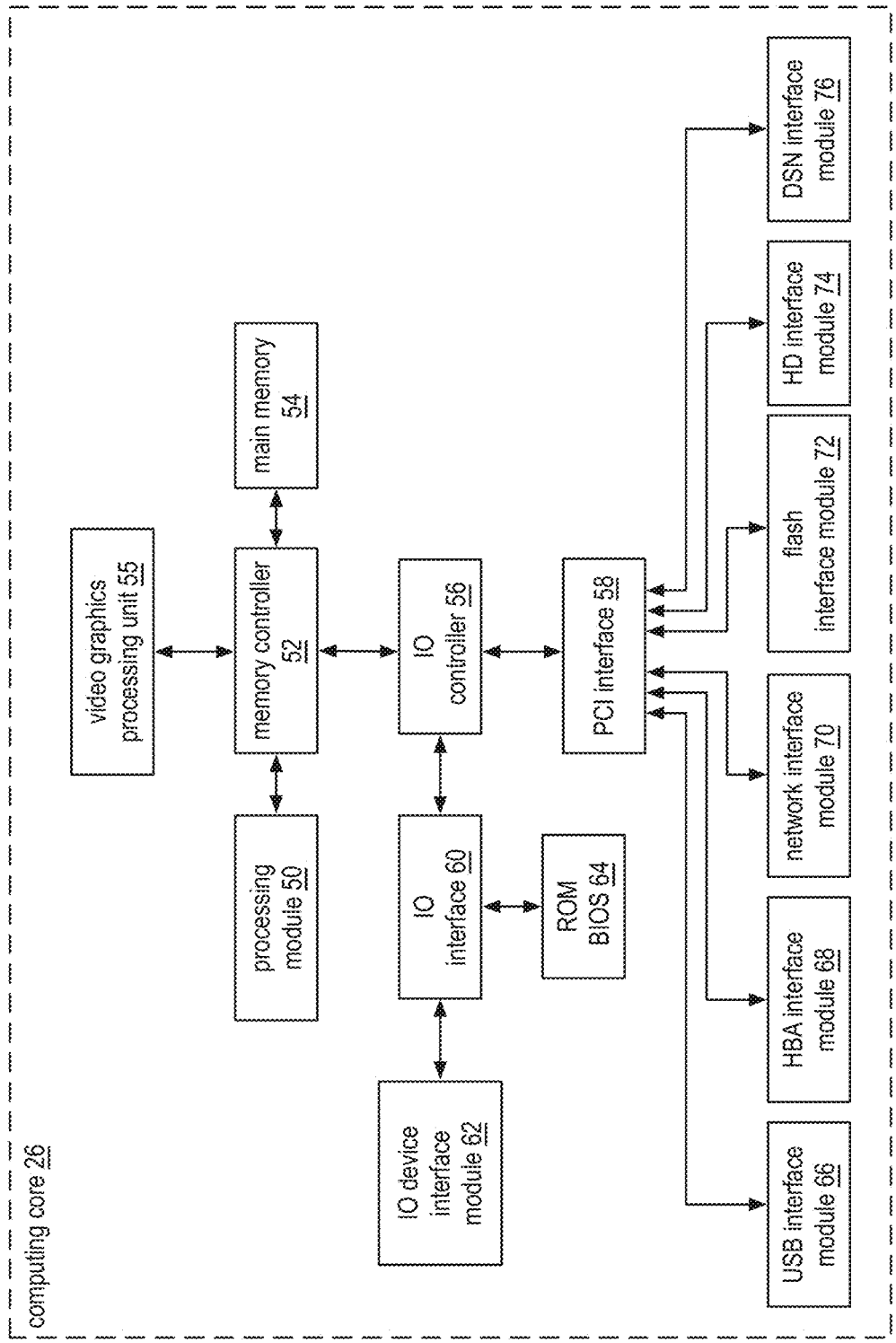
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5 Y.

Figure 7:
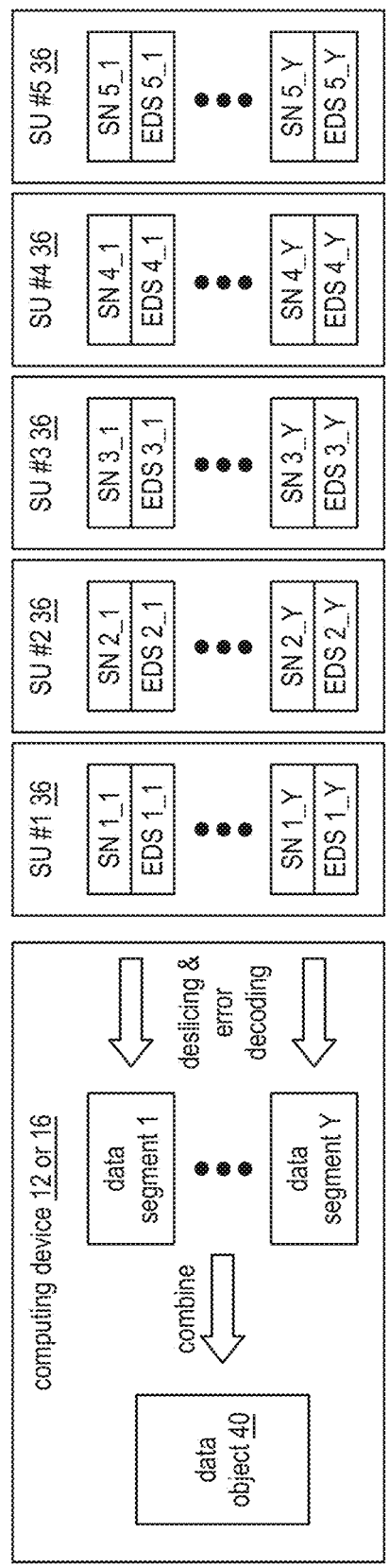
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
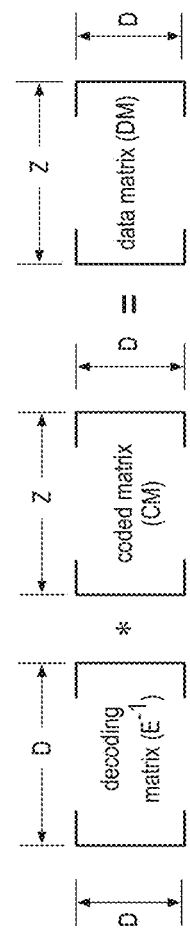
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
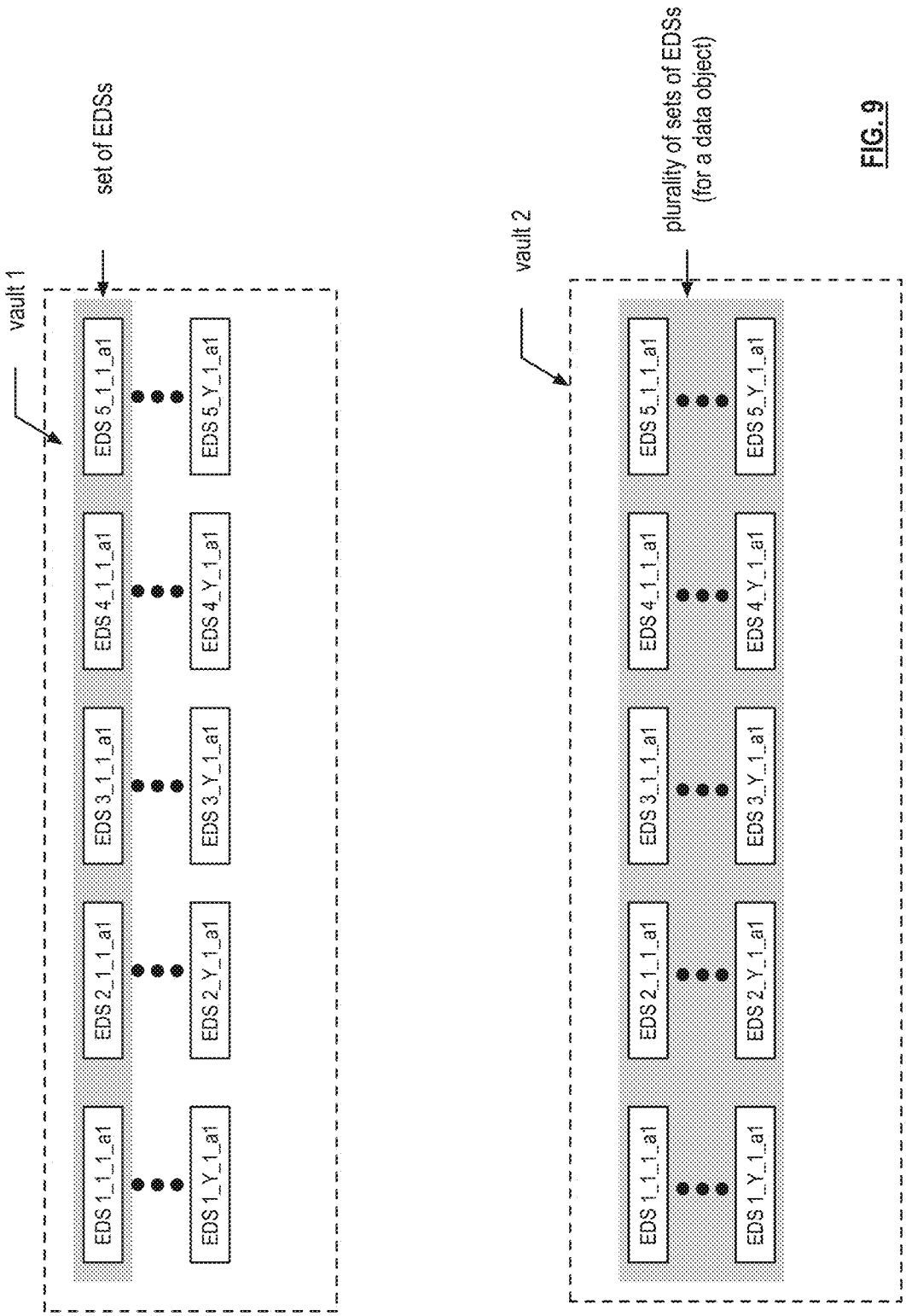
FIG. 9 is a schematic block diagram of an embodiment of an example of storing pluralities of sets of slices across different storage vaults in accordance with the present invention.

FIG. 9 is a schematic block diagram of an example of storing pluralities of sets of slices across different storage vaults. Each plurality of sets of encoded data slices (EDSs) corresponds to the encoding of a data object, a portion of a data object, or multiple data object, where a data object is one or more of a file, text, data, digital information, etc. For example, the highlighted plurality of encoded data slices corresponds to a data object having a data identifier of "a1".

Each encoded data slices of each set of encoded data slices is uniquely identified by its slice name, which is also used as at least part of the DSN address for storing the encoded data slice. As shown, a set of EDSs includes EDS 1_1_1_a1 through EDS 5_1_1_a1. The EDS number includes pillar number, data segment number, vault ID, and data object ID. Thus, for EDS 1_1_1_a1, it is the first EDS of a first data segment of data object "a1" and is to be stored, or is stored, in vault 1. Note that vaults are a logical memory container supported by the storage units of the DSN. A vault may be allocated to one or more user computing devices.

As is further shown, another plurality of sets of encoded data slices are stored in vault 2. As in vault 1, there are Y sets of EDSs, where Y corresponds to the number of data segments created by segmenting the data object. The last set of EDSs of data object "a1" includes EDS 1_Y_2_a1 through EDS 5_Y_2_a1. Thus, for EDS 1_Y_2_a1, it is the first EDS of the last data segment "Y" of data object "b1" and is to be stored, or is stored, in vault 2.

In an example, data objects written to vaults 1 and 2 use the same dispersed storage error encoding parameters. For example, if the error encoding function for the storage of EDSs in vault 1 is a particular information dispersal algorithm (IDA) the same IDA will be used to store a copy in vault 2 (destination vault). The IDA used for a particular vault in this example can be included in an index and/or metadata maintained in the vault. Other error encoding functions may be used, but in each case vaults 1 and the vault storing copies (in this case vault 2) use the same error encoding function. As discussed above, the dispersed storage error encoding parameters for a given data segment are defined by the user computing device(s), along with the designation of the vault for storage of the set of EDSs created from the data segment (the "original" set of EDSs) and the vault for storage of the copy of the set of EDSs. In an example, the object name for the "copy" set of EDS can be tracked in metadata maintained by the vault storing the original set. In another example each vault can also maintain an index of object metadata to allow for efficient look-up of copy tracking data.

In an example, the user computing device(s) transmits a write request to vault 1 for the set of EDSs that includes a reference to the vault where the copy (or copies) of the set of EDSs are stored. In another example, the existence of a copy and the vault reference for the copy can then be included in a header for each of the EDSs in the set of EDSs. Accordingly, a DSN memory-based object storage system could track copies of an object, by supporting a header for client applications to use to indicate a copy of an object. In an example, a processing unit associated with a particular vault can use a hash of the object name to find metadata, including the existence and location of a copy of the data object and/or data segment. The meta data and/or index can be cached locally for access by a given DS processing unit, encoded and stored as dispersed error encoded data.

In an example, DS processing units, such as computing devices 12 and 16 from FIG. 1, maintain a "scorecard" of DS storage unit performance that is constantly updated during the execution of normal DSN functions/interactions. The DS processing units have access to the metadata/index that indicates the existence and location of copy EDS sets, along with the current performance attributes of the physical (memory) devices storing the original and copy EDS sets. In an example, a DS processing unit can respond to a read request from a user by first searching the metadata/index to reveal the existence and location of the original and copy EDSs and then then consulting the "scorecard" for the performance of the memory devices for the vaults storing each. In this example the DS processing unit is then able to use one or more EDSs from the copy set of EDS, if preferable, to respond to the user read request.

Figure 10:
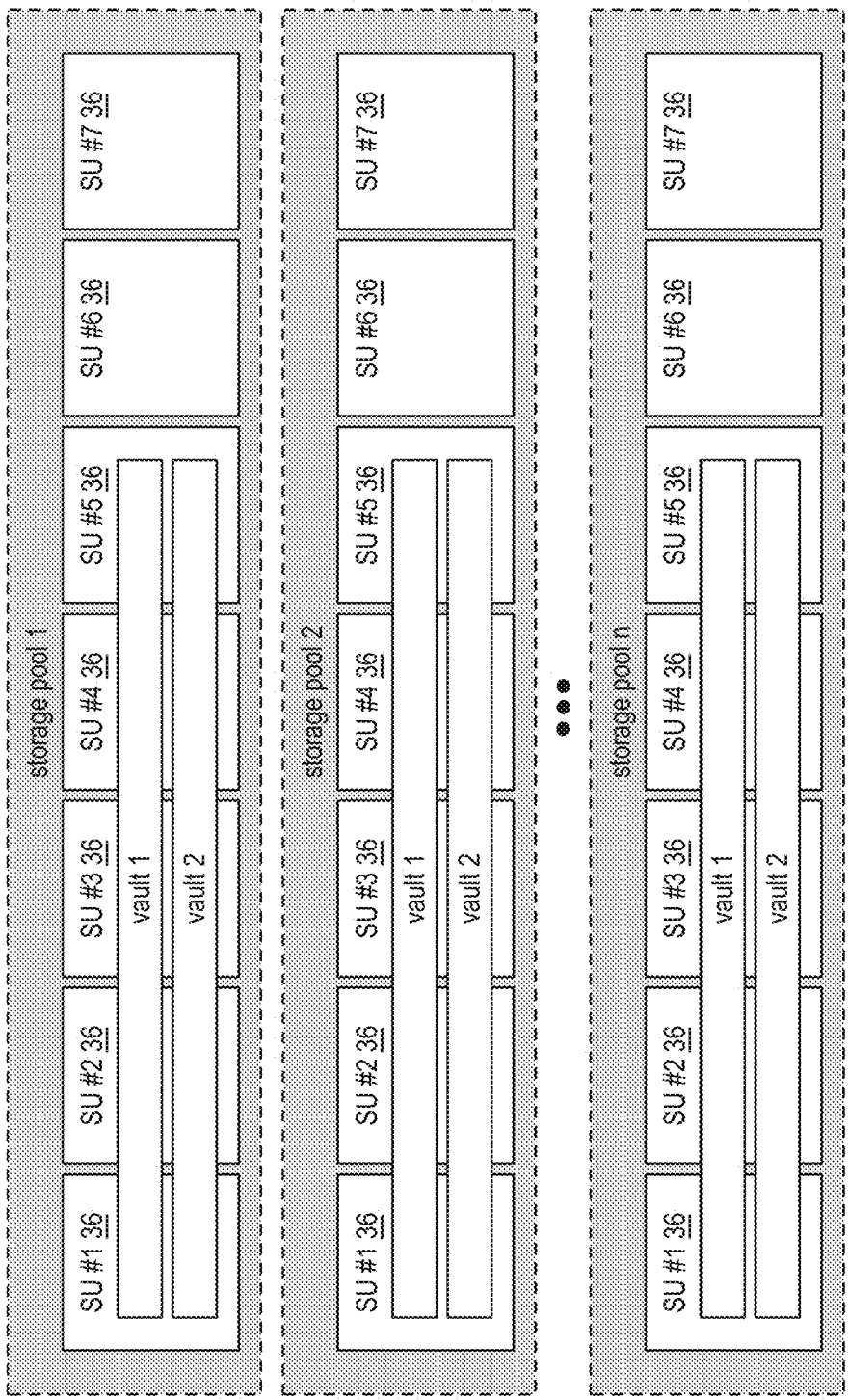
FIG. 10 is a schematic block diagram of an embodiment of an example of storage vaults spanning multiple storage pools in accordance with the present invention.

FIG. 10 is a schematic block diagram of an example of storage vaults spanning multiple storage pools. In this example, the DSN memory 22 includes a plurality of storage units 36 arranged into a plurality of storage pools (e.g., 1-n). In this example, each storage pool includes seven storage units for ease of illustration. A storage pool, however, can have many more storage units than seven and, from storage pool to storage pool, may have different numbers of storage units.

The storage pools 1-n support two vaults (vault 1 and vault 2) using only five of seven of the storage units. The number of storage units within a vault correspond to the pillar width number, which is five in this example. Note that a storage pool may have rows of storage units, where SU #1 represents a plurality of storage units, each corresponding to a first pillar number; SU #2 represents a second plurality of storage units, each corresponding to a second pillar number; and so on. Note that other vaults may use more or less than a width of five storage units.

Vaults 1 and 2 are shown distributed across multiple storage units 36 and across multiple storage pools 1 through n. The original set of EDSs and the copy set of EDSs described with reference to FIG. 9 above can alternatively be distributed across vaults defined within a single storage pool, across multiple storage pools, and across storage units, such that vault 1 is stored within SU #1 36 and vault 2 within SU #2 36, along with variants of these examples.

Examples of scenarios dictating the use of original and copy EDS sets include the use of "mirror" vaults where copies are automatically generated and fan-out applications, where multiple copies are created to accommodate applications such as streaming and geographic distribution of copies. Further examples include archiving applications, such as attachments to electronic mail (email). The number of copy sets of EDSs for a given data segment may exceed one, accordingly the metadata/index and header discussed above may be adapted to accommodate the existence and location of each of the multiple copies.

Figure 11:
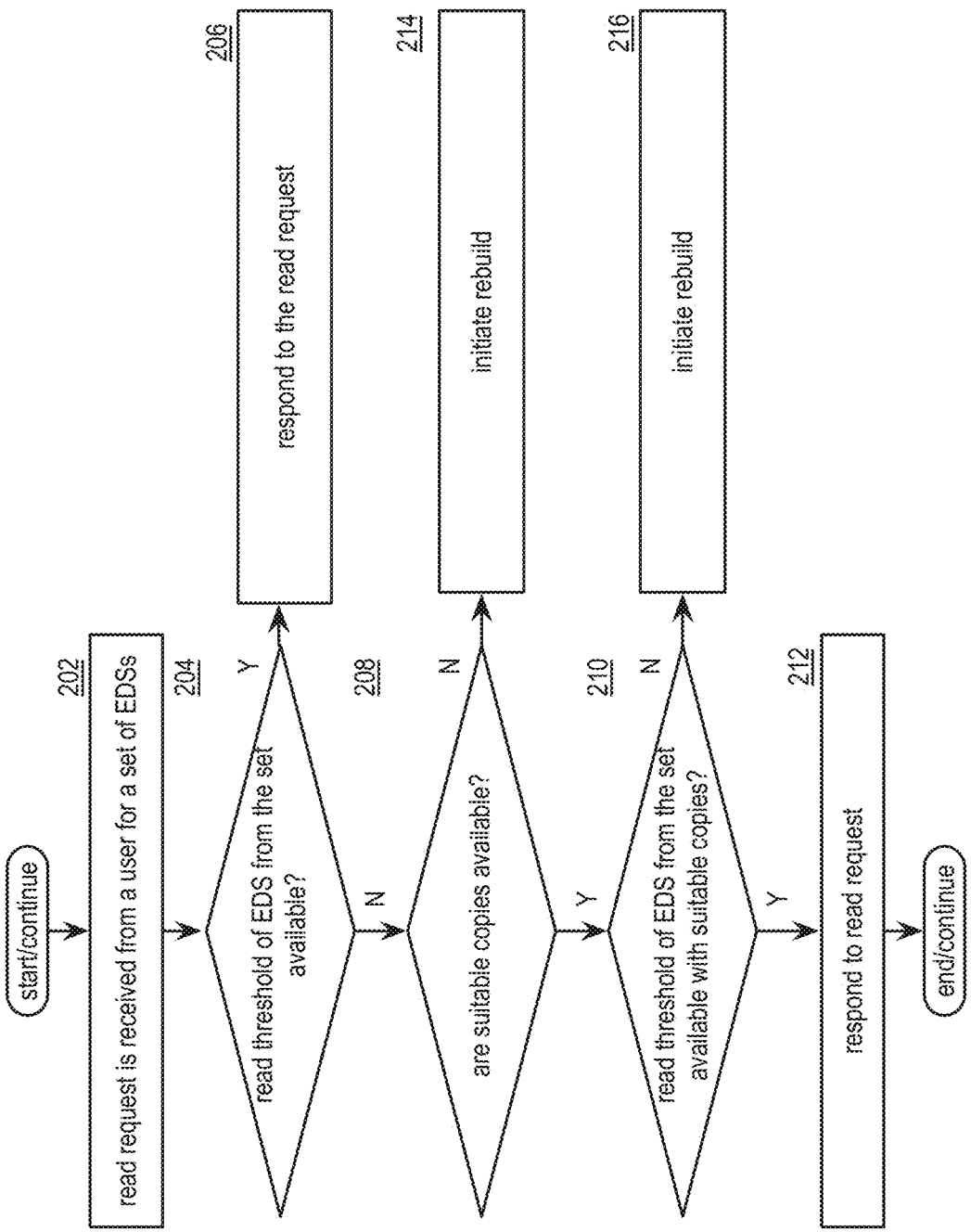
FIG. 11 is an example logic diagram of a method for using copies of encoded data slices (EDSs) to respond to a read request in accordance with the present invention.

FIG. 11 is an example logic diagram of a method for using copies of encoded data slices (EDSs) to respond to a read request. In step 202 one or more processing modules of one or more computing devices of a dispersed storage network (DSN), receives a read request from a user computing device for a set of EDSs. In an example, the read request is for a set of EDSs for which one or more copies of the set of EDSs is also stored within one or more vaults in the DSN. The method continues at step 204 where the one or more processing modules determine the number of EDSs of the set of EDSs that is available and continues at step 204 where the one or more processing modules determines whether the number of the set of EDSs that is "available" within the one or more vaults in the DSN includes at least a read threshold number of EDSs.

An EDS is available, for example, when it meets a minimum reliability threshold, meets a minimum performance threshold, is addressable by the one or more processing modules, and/or can be retrieved within a minimum amount of time. The minimum reliability threshold, minimum performance threshold, and minimum retrieval time can be based on static standards, or they may be derived dynamically to reflect various relatively current attributes of the DSN. These minimum values can be considered "predetermined", because they can be determined before responding to a given read request. Other performance attributes may also be considered to establish whether an EDS is, in fact, available. The DSN based object storage system described using copy EDSs could provide for higher availability and potentially operate with higher performance when the DSN is experiencing availability, reliability or performance issues associated with EDSs for the original object (original EDSs).

If the one or more processing modules determine at step 204 that the number of the set of EDSs that is available within the DSN is less than a read threshold number of EDSs the one or more processing modules determine at step 208 whether one or more additional EDSs within a copy of the set of EDSs is available. The availability of one or more suitable copy EDS can be determined based on a metadata search of vault metadata, which can be used for tracking the existence and destination vault for copy EDSs. The vault metadata can also incorporate an index of the metadata to facilitate faster lookups. In an example, a suitable EDS copy will match the IDS, segment size and read threshold values of the original EDS, which can be collected from the destination vault where the copy EDS are located. The method continues at step 210 with the one or more processing modules determining whether the one or more additional EDSs within the copy of the set of EDSs, when combined with the number of EDSs of the set of EDSs that is available within the DSN, includes a read threshold number of EDSs needed to reconstruct the data segment. When a combination of the one or more additional EDSs within the copy of the set of EDSs and the available EDSs from the set of EDSs is at least a read threshold number of EDSs the one or more processing modules respond at step 212 to the read request from the user computing device based on the another set of EDSs. When an insufficient number of copy EDS are available to meet a read threshold number of EDSs the one or more processors can initiate rebuild at steps 214 and 216 or take whatever additional action is necessary to recover the failed data segment.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:

receiving a read request from a computing device for a set of dispersed encoded data slices (EDSs), wherein a data object is segmented into a plurality of data segments, wherein a data segment of the plurality of data segments is dispersed error encoded in accordance with dispersed error encoding parameters to produce the set of EDSs that is distributedly stored within the DSN, wherein a copy of the set of EDSs is also stored within the DSN, wherein a read threshold number of EDSs is required to reconstruct the data segment;

determining a number of EDSs of the set of EDSs that is available within the DSN;

determining whether the number of the set of EDSs that is available within the DSN includes at least the read threshold number of EDSs;

based on a first determination that the number of the set of EDSs that is available within the DSN is less than the read threshold number of EDSs, determining whether one or more additional EDSs within the copy of the set of EDSs is available that, when combined with the number of EDSs of the set of EDSs that is available within the DSN includes the read threshold number of EDSs that is required to reconstruct the data segment; and based on a second determination that the another set of EDSs includes the read threshold number of EDSs that is required to reconstruct the data segment, responding to the read request from the computing device based on the another set of EDSs.

2. The method of claim 1, wherein the determining whether one or more additional EDSs within the copy of the set of EDSs is available is based at least partly on the one or more processing modules executing a metadata search.

3. The method of claim 1, wherein the determining whether one or more additional EDSs within the copy of the set of EDSs is available is based at least partly on the one or more processing modules executing a search of an object index.

4. The method of claim 1, wherein the determining whether the number of the set of EDSs that is available within the DSN is further based on whether the number of the set of EDSs includes at least one of:
   1) a read threshold number of EDSs meeting a previously determined reliability threshold;
   2) a read threshold number of EDSs being stored in a memory device meeting a previously determined performance threshold;
   3) a read threshold number of EDSs being addressable by the one or more processing modules; and
   4) retrieval of a read threshold number of EDSs taking more than a predetermined amount of time.

5. The method of claim 1, wherein the set of EDSs is stored in a first storage vault and the copy of the set of EDSs is stored in a second storage vault.

6. The method of claim 5, wherein the first storage vault and the second storage vault are determined by the computing device.

7. The method of claim 1, wherein the set of EDSs and the copy of the set of EDSs are encoded using the same dispersed storage error encoding parameters.

8. The method of claim 7, wherein the dispersed storage error encoding parameters include an information dispersal algorithm.

9. A computing device in a distributed storage network (DSN) comprising:
   an interface configured to interface and communicate with a communication system;
   memory that stores operational instructions; and
   processing circuitry operably coupled to the interface and to the memory, wherein the processing circuitry is configured to execute the operational instructions to:
   receive a read request from a user computing device for a set of dispersed encoded data slices (EDSs), wherein a data object is segmented into a plurality of data segments, wherein a data segment of the plurality of data segments is dispersed error encoded in accordance with dispersed error encoding parameters to produce the set of EDSs that is distributedly stored within the DSN, wherein a copy of the set of EDSs is also stored within the DSN, wherein a read threshold number of EDSs is required to reconstruct the data segment;
   determine a number of EDSs of the set of EDSs that is available within the DSN;
   determine whether the number of the set of EDSs that is available within the DSN includes at least the read threshold number of EDSs;
   based on a first determination that the number of the set of EDSs that is available within the DSN is less than the read threshold number of EDSs, determine whether one or more EDSs within the copy of the set of EDSs is available that, when combined with the number of EDSs of the set of EDSs that is available within the DSN includes the read threshold number of EDSs that is required to reconstruct the data segment; and
   based on a second determination that the another set of EDSs includes the read threshold number of EDSs that is required to reconstruct the data segment, respond to the read request from the computing device based on the another set of EDSs.

10. The computing device of claim 9, wherein the determination whether one or more additional EDSs within the copy of the set of EDSs is available is based at least partly on a metadata search.

11. The computing device of claim 9, wherein the determination whether one or more additional EDSs within the copy of the set of EDSs is available is based at least partly on a search of an object index.

12. The computing device of claim 9, wherein the number of the set of EDSs that is available within the DSN is further based on whether the number of the set of EDSs includes at least one of:
   1) a read threshold number of EDSs meeting a previously determined reliability threshold;
   2) a read threshold number of EDSs being stored in a memory device meeting a previously determined performance threshold;
   3) a read threshold number of EDSs being addressable by the computing device; and
   4) retrieval of a read threshold number of EDSs taking more than a predetermined amount of time.

13. The computing device of claim 9, wherein the set of EDSs is stored in a first storage vault and the copy of the set of EDSs is stored in a second storage vault.

14. The computing device of claim 13, wherein the first storage vault and the second storage vault are determined by the computing device.

15. The computing device of claim 9, wherein the set of EDSs and the copy of the set of EDSs are encoded using the same dispersed storage error encoding parameters.

16. The computing device of claim 9, wherein the dispersed storage error encoding parameters include an information dispersal algorithm.

17. A computing device for a distributed storage network (DSN) comprises:
   a first module, when operable within the computing device, causes the computing device to:
   receive a read request from a user computing device for a set of dispersed encoded data slices (EDSs), wherein a data object is segmented into a plurality of data segments, wherein a data segment of the plurality of data segments is dispersed error encoded in accordance with dispersed error encoding parameters to produce the set of EDSs that is distributedly stored within the DSN, wherein a copy of the set of EDSs is also stored within the DSN, wherein a read threshold number of EDSs is required to reconstruct the data segment; and
   determine a number of EDSs of the set of EDSs that is available within the DSN;
   a second module, when operable within the computing device, causes the computing device to:
   determine whether the number of the set of EDSs that is available within the DSN includes at least the read threshold number of EDSs;
   a third module, when operable within the computing device, causes the computing device to:
   based on a first determination that the number of the set of EDSs that is available within the DSN is less than the read threshold number of EDSs, determine whether one or more EDSs within the copy of the set of EDSs is available that, when combined with the number of EDSs of the set of EDSs that is available within the DSN includes the read threshold number of EDSs that is required to reconstruct the data segment; and a fourth module, when operable within the computing device, causes the computing device to:

based on a second determination that the another set of EDSs includes the read threshold number of EDSs that is required to reconstruct the data segment, respond to the read request from the user computing device based on the another set of EDSs.

18. The computing device of claim 17, wherein the determination whether one or more additional EDSs within the copy of the set of EDSs is available is based at least partly on a metadata search.

19. The computing device of claim 17, wherein the determination whether one or more additional EDSs within the copy of the set of EDSs is available is based at least partly on a search of an object index.

20. The computing device of claim 17, wherein the number of the set of EDSs that is available within the DSN is further based on whether the number of the set of EDSs includes at least one of:
   1) a read threshold number of EDSs meeting a previously determined reliability threshold;
   2) a read threshold number of EDSs being stored in a memory device meeting a previously determined performance threshold;
   3) a read threshold number of EDSs being addressable by the computing device; and
   4) retrieval of a read threshold number of EDSs taking more than a predetermined amount of time.

* * * * *